US007988455B2

(12) United States Patent
Blakborn

(10) Patent No.: US 7,988,455 B2
(45) Date of Patent: Aug. 2, 2011

(54) CO-AXIAL PLUG-IN-INSERTION CONNECTOR HAVING A CODING HOUSING

(75) Inventor: Willem Blakborn, Inzell (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 0 days.

(21) Appl. No.: 12/747,256

(22) PCT Filed: Dec. 4, 2008

(86) PCT No.: PCT/EP2008/010300

§ 371 (c)(1), (2), (4) Date: Jun. 10, 2010

(87) PCT Pub. No.: WO2009/074262

PCT Pub. Date: Jun. 18, 2009

(65) Prior Publication Data

US 2010/0261357 A1 Oct. 14, 2010

(30) Foreign Application Priority Data

Dec. 12, 2007 (DE) ..................... 20 2007 017 308 U

(51) Int. Cl.
*H01R 12/00* (2006.01)
*H05K 1/00* (2006.01)

(52) U.S. Cl. .......................................... 439/63; 439/581

(58) Field of Classification Search .................... 439/63, 439/581

See application file for complete search history.

(56) References Cited

U.S. PATENT DOCUMENTS

| | | | | |
|---|---|---|---|---|
| 4,718,854 | A * | 1/1988 | Capp et al. | 439/63 |
| 5,879,166 | A * | 3/1999 | Wang | 439/63 |
| 6,036,545 | A * | 3/2000 | Caviness et al. | 439/620.1 |
| 6,164,977 | A * | 12/2000 | Lester | 439/63 |
| 6,780,051 | B2 * | 8/2004 | Otsu | 439/578 |
| 6,932,616 | B1 * | 8/2005 | Swantner et al. | 439/63 |
| 6,994,564 | B1 * | 2/2006 | Kan | 439/63 |
| 7,727,014 | B2 * | 6/2010 | Zhu et al. | 439/578 |
| 7,766,662 | B2 * | 8/2010 | Akama et al. | 439/63 |
| 2003/0176104 | A1 | 9/2003 | Hall et al. | |
| 2009/0011619 | A1 * | 1/2009 | Akama et al. | 439/63 |

FOREIGN PATENT DOCUMENTS

| | | |
|---|---|---|
| EP | 1566862 A | 8/2005 |
| WO | 99/62140 A | 12/1999 |

* cited by examiner

*Primary Examiner* — Hae Moon Hyeon
(74) *Attorney, Agent, or Firm* — DeLio & Peterson LLC; Robert Curcio

(57) ABSTRACT

The invention relates to a co-axial plug-in-insertion connector which has a center conductor part, an outer conductor part, and an insulating part made of a dielectric material which holds the center conductor part co-axial to the outer conductor part, a coding housing being provided in which the outer conductor part and the center conductor part are arranged, the co-axial plug-in-insertion connector having an insertion end for connection to a complementary co-axial plug-in-insertion connector. Provision is made for the insulating part to be of a one-piece form with the housing.

20 Claims, 1 Drawing Sheet

CO-AXIAL PLUG-IN-INSERTION CONNECTOR HAVING A CODING HOUSING

CROSS REFERENCE TO RELATED APPLICATION

This application is a National Phase filing under 35 U.S.C. §371 of PCT/EP/2008/010300 which was filed Dec. 4, 2008, and claims priority to German Application No. DE 20 2007 017 308.3 filed Dec. 12, 2007.

BACKGROUND OF THE INVENTION

1. Field of the Invention

The present invention relates to a co-axial plug-in-insertion connector which has a center conductor part, an outer conductor part, and an insulating part made of a dielectric material which holds the center conductor part co-axial to the outer conductor part, a coding housing being provided in which the outer conductor part and the center conductor part are arranged, the co-axial plug-in-insertion connector having an insertion end for connection to a complementary co-axial plug-in-insertion connector.

2. Description of Related Art

Known from US 2003/0176104 A1 is a co-axial plug-in-insertion connector which has a housing of plastics material and which complies with what is called the FAKRA (Fachkreis Automobiltechnik) standardization scheme for SMB (Subminiature Version B connections. What is provided in this case is a housing of plastics material which holds and protects the plug-in-insertion connector and pre-positions it for the process of connecting it to another plug-in-insertion connector having a housing of plastics material. The housing has in addition mechanical coding means so that only housings which fit together can be inserted in one another.

Housings of plastics material of this kind for co-axial plug-in-insertion connectors, which are also referred to as FAKRA housings, are used in the automotive industry for data transmission cables. These data transmission cables are usually co-axial cables, or similar cables based on an electrical conductor. The physical dimensions of such FAKRA housings in the interface region, i.e. in an axial portion of the housing which co-operates with a complementary connector to make a mechanical connection between the two housings of plastics material, are laid down in DIN standard 72594-1 in the version of October 2004. The part of the above DIN standard 72594-1 which is entitled "Straβenfahrzeuge—50-Ohm-Hochfrequenz-Schnittstelle (50-Ω-HFSSt)—Teil 1: Maβe and elektrische Anforderungen" [Road vehicles—50 ohm radio-frequency interface (50Ω RFI)—Part 1: Dimensions and electrical requirements] specifies the connectors and couplers for an interface having an impedance of 50 ohms for radio-frequency applications (a 50Ω radio-frequency interface) in road vehicles and thus provides an assurance of communication to and from the motor vehicle. It lays down dimensional and electrical requirements and properties and ensures that these are compatible. All well known carmakers follow this standard in their production. The content of the standard is specified by the Normenausschuss Kraftfahrzeuge (FAKRA) [Standards Committee for Motor Vehicles].

The Standards Committee for Motor Vehicles (FAKRA) at the German Institute for Standardization represents regional, national and international standardization interests in the field of motor vehicles. The terms of reference of FAKRA comprise the drawing up of all standards relating to compatibility, interchangeability and safety for road vehicles to DIN 70010 (except for agricultural tractors), regardless of whether these road vehicles are fitted with internal combustion engines, electric motors or hybrid drives. FAKRA also draws up standards for the bodies of such road vehicles (except for municipal service vehicles, fire brigade vehicles and ambulances). It is responsible in addition for the standardization of all the equipment fitted to the above-mentioned vehicles and bodies and for the standardization of freight containers (ISO containers). Standardization promotes rationalization and quality assurance in motor vehicle design and construction and the environment-friendliness of the motor vehicle. It also makes a contribution to increasing vehicle safety and the safety of transport, in line with the current state of the art and science, to the benefit of manufacturers and consumers.

SUMMARY OF THE INVENTION

Bearing in mind the problems and deficiencies of the prior art, it is therefore an object of the present invention to provide an improved co-axial plug-in-insertion connector of the above-mentioned kind from the point of view of manufacture and assembly.

This object is achieved in accordance with the invention by a co-axial plug-in-insertion connector of the above-mentioned kind which has the characterizing features defined in the claims. Advantageous embodiments of the invention are described in the claims as well.

In a co-axial plug-in-insertion connector of the above-mentioned kind, provision is made in accordance with the invention for the insulating part to be of a one-piece form with the housing.

This has the advantage that a separate insulating part is not needed for assembling the co-axial plug-in-insertion connector, thus simplifying manufacture and assembly.

Still other objects and advantages of the invention will in part be obvious and will in part be apparent from the specification.

The above and other objects, which will be apparent to those skilled in the art, are achieved in the present invention which is directed to a coaxial plug connector comprising: an internal conductor part; an external conductor part; and an insulating part including a dielectric material holding the internal conductor part coaxially in relation to the external conductor part; a housing having the external conductor part and the internal conductor part being arranged therein; the coaxial plug connector having a plugging-side end for connection to a complementary coaxial plug connector; the insulating part being integrally formed with the housing; the coaxial plug connector including a coding housing, with the external conductor part, the internal conductor part, and the coding housing being formed in such a way that, for assembly of the coaxial plug connector, the external conductor part and the internal conductor part can be inserted into the coding housing from the plugging-side end.

The coaxial plug connector including having the coding housing produced entirely from a dielectric material or in the form of an injection-molded part.

In the coaxial plug interface region, the coding housing may include mechanical dimensions which correspond to the FAKRA standardization scheme for 50 Ω radio-frequency interfaces.

The external conductor part may include at least one, two, or four, first contact pins, with at least one first opening being arranged and formed in the coding housing in such a way that, when the external conductor part is mounted in the coding housing, the at least one first contact pin of the external conductor part extends through the at least one first opening.

The at least one first contact pin of the external conductor part may be arranged at an end of the external conductor part which is situated opposite the plugging-side end.

The coaxial plug connector may comprise a straight plug connector or angled plug connector. The external conductor part, the internal conductor part, or both, may be in the form of a stamped and bent part.

The coaxial plug connector may be electrically and mechanically connected to a printed circuit board.

The internal conductor part may include at least one second contact pin, with at least one second opening being arranged and formed in the coding housing in such a way that, when the internal conductor part is mounted in the coding housing, the second contact pin of the internal conductor part extends through the at least one second opening.

The at least one first contact pin of the internal conductor may be arranged at an end of the internal conductor part which is situated opposite the plugging-side end.

The coaxial plug connector may be in the form of a plug or socket.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
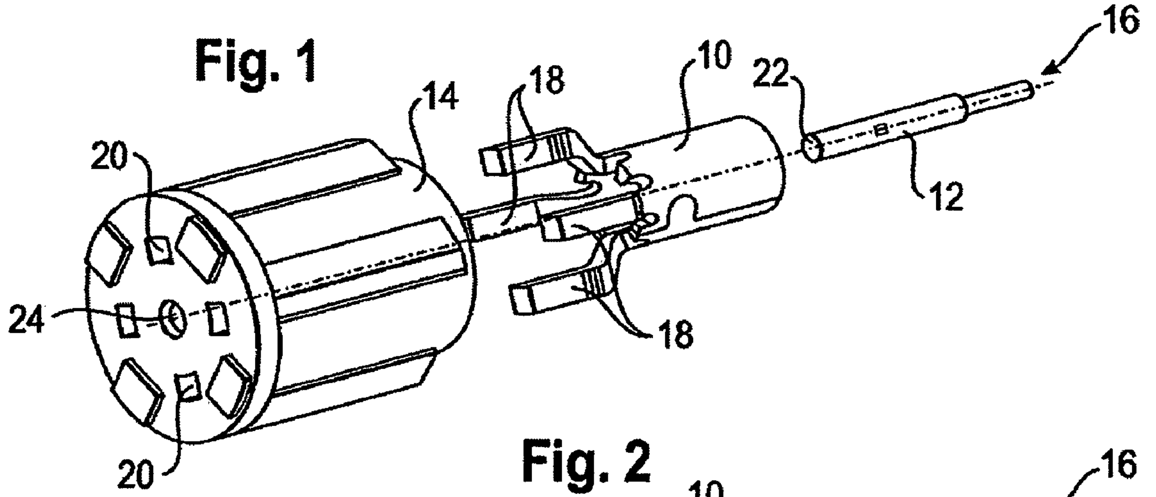
FIG. 1 is an exploded view of a preferred embodiment of co-axial plug-in-insertion connector according to the invention.
Figure 2:
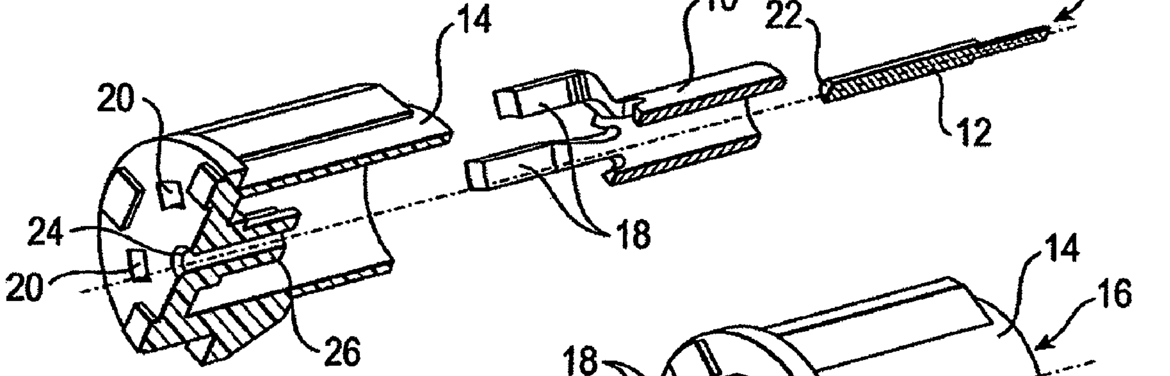
FIG. 2 is an exploded view in section of the co-axial plug-in-insertion connector shown in FIG. 1.
Figure 3:
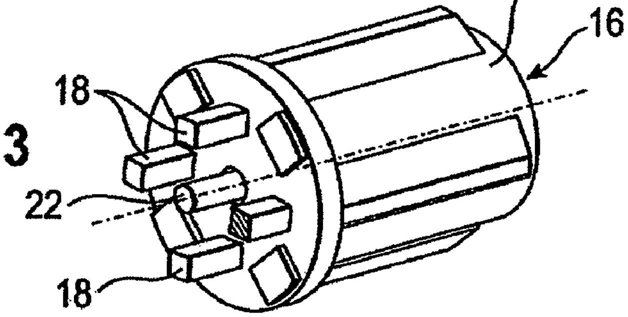
FIG. 3 is a perspective view showing the co-axial plug-in-insertion connector shown in FIG. 1 in the assembled state.
Figure 4:
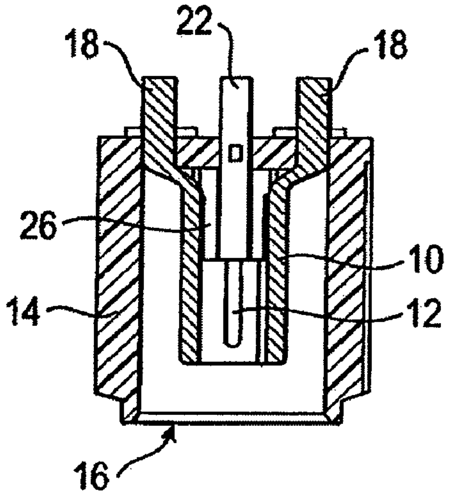
FIG. 4 is a view in section showing the co-axial plug-in-insertion connector shown in FIG. 1 in the assembled state.
Figure 5:
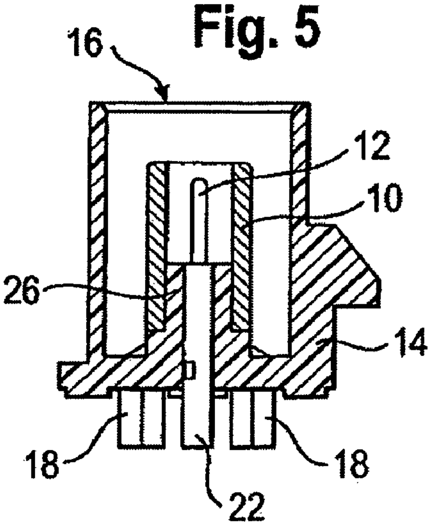
FIG. 5 is a further view in section showing the co-axial plug-in-insertion connector shown in FIG. 1 in the assembled state.

In describing the preferred embodiment of the present invention, reference will be made herein to FIGS. 1-5 of the drawings in which like numerals refer to like features of the invention.

In a preferred embodiment, the coding housing takes the form of an injection moulding. The coding housing is usefully made entirely of a dielectric material.

The coding housing is for example so designed that its physical dimensions are, in its interface region, ones which comply with the FAKRA standardization scheme for 50Ω radio-frequency interfaces.

In an embodiment which is a particular preference, the outer conductor part has at least one, and in particular two, three, or four, first contact pins, with at least one first opening being so arranged and formed in the coding housing that, when the outer conductor part is fitted into the coding housing, the at least one first contact pin of the outer conductor part fits through the at least one first opening. The at least one first contact pin of the outer conductor part is preferably arranged in this case at an end of the outer conductor part which is opposite from the insertion end.

The co-axial plug-in-insertion connector usefully takes the form of a straight plug-in-insertion connector or an angled plug-in-insertion connector.

Particularly inexpensive manufacture of the co-axial plug-in-insertion connector according to the invention is achieved by having the outer conductor part and/or the center conductor part take the form of a stamped or pressed bent part.

The co-axial plug-in-insertion connector is usefully designed for electrical and mechanical connection to a printed circuit board (PCB).

In a preferred embodiment, the center conductor part has at least one second contact pin, with at least one second opening being so arranged and formed in the coding housing that, when the center conductor part is fitted into the coding housing, the second contact pin of the center conductor part fits through the at least one second opening. The at least one second contact pin of the center conductor part is preferably arranged in this case at an end of the center conductor part which is opposite from the insertion end.

The co-axial plug-in-insertion connector usefully takes the form of a plug or a socket.

The preferred embodiment of co-axial plug-in-insertion connector according to the invention which is shown in FIGS. 1 to 5 comprises an outer conductor part 10, a center conductor part 12 and a coding housing 14. The co-axial plug-in-insertion connector has an insertion end 16 which has an interface region and which is designed to be connected electrically and mechanically to a complementary co-axial plug-in-insertion connector. The physical dimensions of the coding housing 14 in its interface region 16 are for example ones which comply with the FAKRA standardization scheme for 50Ω radio-frequency interfaces.

The outer conductor part 10, the center conductor part 12 and the coding housing 14 are so designed that, for the co-axial plug-in-insertion connector to be assembled, the outer conductor part 10 and the center conductor part 12 can be inserted in the coding housing 14 from the insertion end 16.

The outer conductor part 10 has four first contact pins 18, and the coding housing 14 is formed to have four first openings 20, in such a way that, when the outer conductor part 10 is fitted into the coding housing 14, the first contact pins 18 fit through respective first openings 20. The center conductor part 12 has a second contact pin 22, and the coding housing 14 is formed to have a second opening 24, in such a way that, when the center conductor part 12 is fitted into the coding housing 14, the second contact pin 22 fits through the second opening 24.

In accordance with the invention, there is provided in one piece with the coding housing 14 an insulating part 26 which holds the center conductor part 12 co-axial to the outer conductor part 10 in the co-axial plug-in-insertion connector. This insulating part 26 is made of a dielectric material. The dielectric material and the thickness of the insulating part 26 in the radial direction are selected in this case to be such that a predetermined desired characteristic impedance results. The entire coding housing is preferably produced from this dielectric material in the form of an injection moulding.

The end, opposite from the insertion 16, which has the first and second openings 20, 24 in the coding housing 14 is designed for connection to a printed circuit board (not shown). For this purpose, the first and second contact pins 18, 22 fit into corresponding openings in a region which is referred to as a “footprint” on the printed circuit, in which region the co-axial plug-in-insertion connector is connected electrically and mechanically to the printed circuit board.

The outer conductor part 10 and center conductor part 12 are in the form of stamped or pressed bent parts.

In the embodiment shown, the co-axial plug-in-insertion connector takes the form of a socket. It is not however essential for it to do so. The co-axial plug-in-insertion connector may also take the form of a plug.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A coaxial plug connector comprising:

an internal conductor part;

an external conductor part; and an insulating part including a dielectric material holding the internal conductor part coaxially in relation to the external conductor part;

a coding housing having the external conductor part and the internal conductor part being arranged therein;

said coaxial plug connector having a plugging-side end for connection to a complementary coaxial plug connector;

said insulating part being integrally formed with the coding housing;

said coding housing being formed in such a way that, for assembly of the coaxial plug connector, the external conductor part and the internal conductor part can be inserted into the coding housing from the plugging-side end.

2. The coaxial plug connector of claim 1, including said coding housing produced entirely from a dielectric material.

3. The coaxial plug connector of claim 1, including said coding housing in the form of an injection-molded part.

4. The coaxial plug connector of claim 1, wherein the coding housing includes, within an interface region of said coaxial plug connector, mechanical dimensions which correspond to the FAKRA standardization scheme for 50 Ω radio-frequency interfaces.

5. The coaxial plug connector of claim 1, wherein the external conductor part includes at least one, two, or four, first contact pins, with at least one first opening being arranged and formed in the coding housing in such a way that, when the external conductor part is mounted in the coding housing, the at least one first contact pin of the external conductor part extends through the at least one first opening.

6. The coaxial plug connector of claim 5, including the at least one first contact pin of the external conductor part arranged at an end of the external conductor part which is situated opposite the plugging-side end.

7. The coaxial plug connector of claim 1, wherein the coaxial plug connector comprises the form of a straight plug connector.

8. The coaxial plug connector of claim 1, including the external conductor part, the internal conductor part, or both, in the form of a stamped and bent part.

9. The coaxial plug connector of claim 1, including the coaxial plug connector electrically and mechanically connected to a printed circuit board.

10. The coaxial plug connector of claim 1, wherein the internal conductor part includes at least one second contact pin, with at least one second opening being arranged and formed in the coding housing in such a way that, when the internal conductor part is mounted in the coding housing, the second contact pin of the internal conductor part extends through the at least one second opening.

11. The coaxial plug connector of claim 10, including the at least one first contact pin of the internal conductor part arranged at an end of the internal conductor part which is situated opposite the plugging-side end.

12. The coaxial plug connector of claim 1, including the coaxial plug connector in the form of a plug or socket.

13. The coaxial plug connector of claim 4, wherein the external conductor part includes at least one, two, or four, first contact pins, with at least one first opening being arranged and formed in the coding housing in such a way that, when the external conductor part is mounted in the coding housing, the at least one first contact pin of the external conductor part extends through the at least one first opening.

14. The coaxial plug connector of claim 13, including the at least one first contact pin of the external conductor part arranged at an end of the external conductor part which is situated opposite the plugging-side end.

15. The coaxial plug connector of claim 5, wherein the coaxial plug connector comprises the form of a straight plug connector.

16. The coaxial plug connector of claim 5, including the external conductor part, the internal conductor part, or both, in the form of a stamped and bent part.

17. The coaxial plug connector of claim 5, including the coaxial plug connector electrically and mechanically connected to a printed circuit board.

18. The coaxial plug connector of claim 5, wherein the internal conductor part includes at least one second contact pin, with at least one second opening being arranged and formed in the coding housing in such a way that, when the internal conductor part is mounted in the coding housing, the second contact pin of the internal conductor part extends through the at least one second opening.

19. The coaxial plug connector of claim 18, including the at least one first contact pin of the internal conductor arranged at an end of the internal conductor part which is situated opposite the plugging-side end.

20. The coaxial plug connector of claim 5, including the coaxial plug connector in the form of a plug or socket.

* * * * *